(12) United States Patent
Park et al.

(10) Patent No.: US 11,423,190 B2
(45) Date of Patent: Aug. 23, 2022

(54) NUCLEAR POWER PLANT DATA-BASED DESIGN BASIS MANAGEMENT SYSTEM AND METHOD THEREFOR

(71) Applicants: KOREA HYDRO & NUCLEAR POWER CO., LTD, Seoul (KR); PARTDB INC., Daejeon (KR)

(72) Inventors: You Jin Park, Daejeon (KR); Jae Kyoung Lee, Daejeon (KR); Mu Byeong Yoon, Daejeon (KR); Su Jin Byon, Daejeon (KR); Woo Joong Kim, Daejeon (KR); Jin Sang Hwang, Daejeon (KR); Jeong Wook Kim, Daejeon (KR)

(73) Assignees: KOREA HYDRO & NUCLEAR POWER CO., LTD, Seoul (KR); PARTDB INC., Daejeon (KR)

( * ) Notice: Subject to any disclaimer, the term of this patent is extended or adjusted under 35 U.S.C. 154(b) by 959 days.

(21) Appl. No.: 16/099,759

(22) PCT Filed: May 25, 2016

(86) PCT No.: PCT/KR2016/005535
§ 371 (c)(1),
(2) Date: Nov. 8, 2018

(87) PCT Pub. No.: WO2017/195926
PCT Pub. Date: Nov. 16, 2017

(65) Prior Publication Data
US 2019/0121920 A1    Apr. 25, 2019

(30) Foreign Application Priority Data
May 12, 2016 (KR) .................. 10-2016-0058244

(51) Int. Cl.
*G06F 30/13* (2020.01)
*G06F 30/00* (2020.01)
(Continued)

(52) U.S. Cl.
CPC .............. *G06F 30/13* (2020.01); *G06F 30/00* (2020.01); *G06Q 50/08* (2013.01); *G21D 1/00* (2013.01);
(Continued)

(58) Field of Classification Search
None
See application file for complete search history.

(56) References Cited

U.S. PATENT DOCUMENTS 6,748,348 B1 * 6/2004 Russell, II ............... G21D 3/08
700/28
7,424,412 B2 * 9/2008 Kropaczek ........... G21C 19/205
376/256
(Continued)

FOREIGN PATENT DOCUMENTS

| KR | 20100048449 A | 5/2010 |
|----|---------------|--------|
| KR | 20140055294 A | 5/2014 |

(Continued)

*Primary Examiner* — Bernarr E Gregory
(74) *Attorney, Agent, or Firm* — Occhiuti & Rohlicek LLP

(57) ABSTRACT

A data-based nuclear power plant design basis management system and a method therefor are disclosed. According to an embodiment of the present invention, the data-based nuclear power plant design basis management system comprises a (Continued)

database for storing: information on a plurality of design basis for defining a design basis document for configuration management in a nuclear power plant; information on a category, corresponding to each of the design basis, among a plurality of categories; and an associative relationship between the plurality of design basis, wherein the plurality of categories includes design requirements (REQ), at least one design basis specification (DBS) for satisfying the REQ, and the like.

13 Claims, 14 Drawing Sheets

(51) Int. Cl.
  G06Q 50/08 (2012.01)
  G21D 1/00 (2006.01)
(52) U.S. Cl.
  CPC ............... *Y02E 30/30* (2013.01); *Y02E 60/00* (2013.01); *Y04S 10/50* (2013.01); *Y04S 40/20* (2013.01)

(56) References Cited

U.S. PATENT DOCUMENTS

| | | | |
|---|---|---|---|
| 8,109,766 B2* | 2/2012 | Russell, II | G21D 3/08 434/218 |
| 8,606,548 B2* | 12/2013 | Webster | G06Q 10/10 715/224 |
| 8,873,698 B2* | 10/2014 | Kropaczek | G21C 19/205 376/463 |
| 2004/0122632 A1* | 6/2004 | Kropaczek | G21C 19/205 703/2 |
| 2006/0149515 A1* | 7/2006 | Horton | G21C 7/36 703/6 |

FOREIGN PATENT DOCUMENTS

| | | |
|---|---|---|
| KR | 101513056 B1 | 5/2015 |
| KR | 101600257 B1 | 3/2016 |
| KR | 20160051087 A | 5/2016 |

* cited by examiner

NUCLEAR POWER PLANT DATA-BASED DESIGN BASIS MANAGEMENT SYSTEM AND METHOD THEREFOR

CROSS-REFERENCE TO RELATED APPLICATIONS

This application is the U.S. National Stage of International Application No. PCT/KR2016/005535, filed on May 25, 2016, which claims the priority filing date of Korean Application No. 10 2016 0058244, filed on May 12, 2016.

TECHNICAL FIELD

The present invention relates to a nuclear power plant data-based design basis management system and a method therefor and, more particularly, to a system and method that can provide efficiency for configuration management in a nuclear power plant because a design basis document necessary for configuration management in a nuclear power plant can be managed in a systematic and integrated manner.

BACKGROUND ART

Nuclear power plants (hereinafter, "nuclear plants") demand a very high level of safety. To this end, there is a need to apply the concept of configuration management.

Configuration management in a nuclear plant involves a system that always maintains consistency in nuclear plant design basis, facility configuration information, and physical configuration, which requires meeting contractors' and regulators' requirements and verifying and checking all configuration information if necessary. A configuration management process is an integrated management system that evaluates proposed changes to the configuration of a nuclear plant, determines the impact of such changes and implements the best way to implement the changes, and fulfills the procedures of approval, implementation, and documentation of changes to the configuration of the nuclear plant. A configuration management computer system for meeting these requirements should identify a configuration management target, define a product's architecture, track the impact of changes, and clearly express the association between information.

This allows for maintaining/managing consistency among design requirements for systems, structures, and components in a nuclear plant, facility configuration information (for example, a variety of design documents, drawings, and data), and physical plant configurations.

For a nuclear plant's configuration management, a design basis document is quite important. The design basis document may refer to a document that identifies the attributes of systems, structures, components, and topical areas and systematically integrates related documents and design basis information.

A design basis document is used to verify that the corresponding design meets higher-tier requirements by documenting and integrating design requirements, performance requirements, and specific parameters, all of which define design basis, can rule out factors degrading the safety of the nuclear plant by ensuring that facility replacements and performance changes occurring in the operation of the nuclear plant are carried out in compliance with the design basis, allows for integrated management of dispersed design basis when making changes to the design basis to improve the nuclear plant's performance, even with the complex association between the design basis, and serves as information that can be widely used as reference for operation, maintenance, and repair.

Despite the importance of design basis documents, the traditional configuration management using design basis documents has not been very satisfactory due to the difficulties in putting together a huge amount of information.

Moreover, there is currently no association between design basis documents even if design basis documents are created and used, but the categories of design basis included in a design basis document and a huge amount of information on design basis included in each category are simply managed in printouts. This makes it very difficult to review design basis documents when designing a nuclear plant or making design changes or when operating, maintaining, and repairing it. Also, it is practically very difficult to efficiently find associated design basis, since design basis to be included in a design basis document are fragmentarily described and dispersed in massive amounts of documents.

DISCLOSURE

Technical Problem

Accordingly, a technical problem to be solved by the present invention is to computerize design basis to be included in a design basis document, to effectively define an associative relationship between design basis, and to provide an effective system and method for a nuclear plant's operating entity to intuitively and efficiently detect and recognize design basis associated with a particular facility, using the associative relationship, when making design changes or in the operation or maintenance and repair of the nuclear plant.

Technical Solution

An exemplary embodiment of the present invention provides a nuclear power plant data-based design basis management system, the system comprising: a database that stores information on a plurality of design basis for defining a design basis document for configuration management in a nuclear power plant, information on categories corresponding to the design basis, among a plurality of categories, and an associative relationship between the plurality of design basis; a control module that, when a particular design basis corresponding to a particular one of the plurality of categories is selected by a user terminal, extracts provided information of the selected particular design basis from the database, the provided information of the particular design basis comprising information on the particular design basis and information on associated design basis having an associative relationship with the particular design basis and falling into other categories; and an interface module for providing the information extracted by the control module to the user terminal via a predetermined user interface, wherein the plurality of categories comprise design requirements (REQ), at least one design basis specification (DBS) for satisfying the design requirements, at least one structure, system, and component specification (SSCS) for satisfying the design basis specifications, supporting operation information (SOI), design parameters (DP), and supporting design information (SDI) for satisfying the structure, system, and component specifications, and physical structure, system, and component specification data (PSSCD) complying with the supporting operation information (SOI), design parameters (DP), and supporting design information (SDI).

The associative relationship is classified as a higher-tier, lower-tier, or same-tier category relationship between the design basis, wherein, when the particular design basis is selected, the control module provides the user terminal with associated design basis corresponding to higher-tier, lower-tier, and same-tier categories of the particular design basis in a distinguishable way.

The design requirements (REQ) are defined as a top-tier category, the design basis specifications (DBS) are defined as a lower-tier category of the design requirements (REQ), the structure, system, and component specifications (SSCS) are defined as a lower-tier category of the design basis specifications, the supporting operation information (SOI), design parameters (DP), and supporting design information (SDI) are defined as lower-tier categories of the structure, system, and component specifications, the physical structure, system, and component specification data (PSSCD) is defined as a lower-tier category of the supporting operation information (SOI), design parameters (DP), and supporting design information (SDI), and the supporting operation information (SOI), design parameters (DP), and supporting design information (SDI) are defined as same-tier categories.

The database stores information on a reference document for each of the design basis, and, when the particular design basis is selected, the control module provides information on the reference document through the interface module if there is a reference document for the particular design basis.

The database stores tag information for a facility corresponding to the physical structure, system, and component specification data (PSSCD).

The database further comprises physical plant configuration information for a facility corresponding to the physical structure, system, and component specification data (PSSCD), and, when the physical structure, system, and component specification data is selected, the control module provides the physical plant configuration information.

The control module creates traceable associative relationship information hierarchically representing information on a plurality of design basis having an associative relationship, from particular physical structure, system, and component specification data to the design requirements category, which is a top-tier category corresponding to the particular physical structure, system, and component specification data, and provides the created traceable associative relationship information to the user terminal.

When a certain design basis included in the traceable associative relationship information is selected, the user provides provided information of the selected design basis to the user terminal.

Another exemplary embodiment of the present invention provides a nuclear power plant data-based design basis management method, the method comprising: storing, by a nuclear power plant data-based design basis management system, information on a plurality of categories for defining a design basis document for configuration management in a nuclear power plant, information on at least one design basis included in each of the categories, and an associative relationship between the plurality of design basis; when a particular design basis corresponding to a particular one of the plurality of categories is selected by a user terminal, extracting, by the nuclear power plant data-based design basis management system, provided information of the selected particular design basis from the database, the provided information of the particular design basis comprising information on the particular design basis and information on associated design basis having an associative relationship with the particular design basis and falling into other categories; and providing, by the nuclear power plant data-based design basis management system, the extracted information to the user terminal via a predetermined user interface.

In the step of providing, by the nuclear power plant data-based design basis management system, the extracted information to the user terminal via a predetermined user interface, the nuclear power plant data-based design basis management system provides the user terminal with associated design basis corresponding to higher-tier, lower-tier, and same-tier categories of the particular design basis in a distinguishable way.

In the step of, when a particular design basis corresponding to a particular one of the plurality of categories is selected by the user terminal, extracting, by the nuclear power plant data-based design basis management system, provided information of the particular design basis from the database, if the particular design basis is the physical structure, system, and component specification data (PSSCD), the nuclear power plant data-based design basis management system extracts physical plant configuration information for a facility corresponding to the physical structure, system, and component specification data and includes the same in the provided information of the particular design basis.

The nuclear power plant data-based design basis management method further comprises: creating, by the nuclear power plant data-based design basis management system, traceable associative relationship information hierarchically representing information on a plurality of design basis having an associative relationship, from particular physical structure, system, and component specification data to the design requirements category, which is a top-tier category corresponding to the particular physical structure, system, and component specification data; and providing the created traceable associative relationship information to the user terminal.

The nuclear power plant data-based design basis management method may be implemented by a computer program in combination with hardware.

Advantageous Effects

A technical spirit of the present invention offers the advantage of computerizing design basis to be included in a design basis document, effectively defining an associative relationship between design basis, and making effective use of the design basis document, using the associative relationship, in design, operation, or maintenance and repair.

Furthermore, the user may intuitively find an association between associated design basis and a hierarchical relationship between them since they can distinguish associated design basis corresponding to higher-tier, same-tier, and lower-tier categories from each other when selecting a particular design basis, and this may be advantageous when detecting related reference information.

Furthermore, the user can check design basis associated with a particular facility at a time, from bottom-to-tier categories representing the particular facility, thereby allowing for integrated detection and management when a user action is needed on the particular facility.

DESCRIPTION OF DRAWINGS

A brief description of each drawing is provided in order to more fully understand the drawings cited in the detailed description of the present invention.

MODE FOR INVENTION

Figure 1:
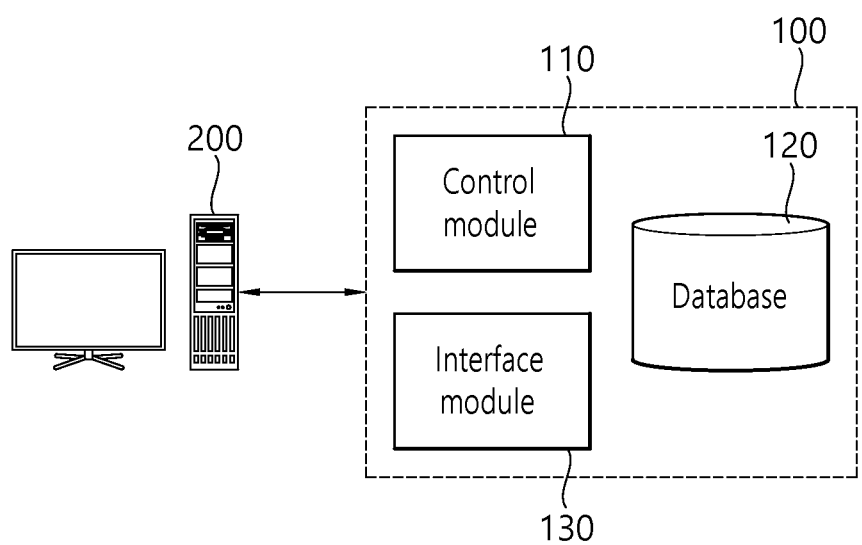
FIG. 1 shows a schematic configuration of a nuclear power plant data-based design basis management system according to an embodiment of the present invention.

To fully understand the present invention, operational advantages of the present invention, and objects achieved by implementing the present invention, exemplary embodiments of the present invention will be described with reference to the illustrated accompanying drawings and what is shown in the accompanying drawings.

In the present specification, when one component "transmits" data to another component, it means that the component may transmit the data directly to the other component, or may transmit the data to the other component through at least one other component. In contrast, when one component "directly transmits" data to another component, it means that the data is transmitted to the other component without passing through another component.

It will be understood that although the terms "first", "second", etc. may be used herein to describe various components, these components should not be limited by these terms. These components are only used to distinguish one component from another.

The terminology used herein is for the purpose of describing particular aspects only and is not intended to limit the scope of the presently disclosed embodiment. As used herein, the singular forms "a", "an", and "the" are intended to include the plural forms as well, unless the context clearly indicates otherwise.

It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

Hereinafter, the present invention will be described in detail, mainly with respect to the exemplary embodiments of the present invention, with reference to the accompanying drawings. In the drawings, like reference numerals denote like elements.

FIG. 1 shows a schematic configuration of a nuclear power plant data-based design basis management system according to an embodiment of the present invention.

Referring to FIG. 1, a nuclear power plant data-based design basis management system 100 (hereinafter, "management system") according to an embodiment of the present invention may realize the technical idea of the present invention while communicating with a user terminal 200.

The management system 100 may realize the technical idea of the present invention by organically combining software for realizing the technical idea of the present invention and hardware for running the software.

The management system 100 may be implemented as a separate physical device from the user terminal 200 to realize the technical idea of the present invention while they are communicating with each other. In some examples of implementation, the management system 100 may be included in the user terminal 200. That is, the management system 100 may be implemented by installing software for implementing the management system 100 on the user terminal 200.

The management system 100 may easily detect information on design basis corresponding to a particular facility in accordance with the technical idea of the present invention and provide it to the user terminal 200.

The design basis may refer to information that defines requirements for the design and construction of a nuclear plant or the operation and maintenance and repair of it. Configuration management in the nuclear plant may be carried out through the management of design basis, and the management system 100 according to the technical idea of the present invention has the advantage of efficiently carrying out the configuration management. For efficient configuration management, it may be necessary to quickly detect a design basis a particular facility at the nuclear plant should fulfill and to intuitively find an associative relationship between design basis associated with the particular facility and having an associative relationship with each other and their hierarchical relationship. That is, there may be a plurality of design basis a particular facility should fulfill, and the plurality of design basis may be defined to have a hierarchical relationship.

To this end, design basis may be divided into a plurality of categories.

For instance, design basis may be divided into the following categories: design requirements (REQ), design basis specifications (DBS), structure, system, and component specifications (SSCS), supporting operation information (SOI), design parameters (DP), supporting design information (SDI), and physical structure, system, and component specification data (PSSCD).

Moreover, the categories may have an associative relationship. This may mean that specific design basis corresponding to each category may have an associative relationship with design basis corresponding to other categories. Such an associative relationship may be information that defines the categories in a hierarchical structure, and the design basis may fall into one of these categories so as to have such an associative relationship.

For instance, the design requirements (REQ) may be basis that define top-tier requirements a particular system at the nuclear plant should meet. The design requirements (REQ) include comprehensive requirements that should be met for the construction and operation of the nuclear plant, and may include laws, regulatory requirements, other laws and regulations and technical standards, contract requirements, etc. For example, approval and permit requirements (construction and operation permit requirements), regulatory requirements such as administrative orders by regulators, non-regulatory requirements such as contract requirements or utility requirements, laws and regulations or standards, etc. may be included in the design requirements (REQ).

The design basis specifications (DBS) translate the requirements defined in the design requirements) into high-tier statements, which may include specific design basis specifications that describe how a particular nuclear plant design is defined, in order to meet general and comprehensive design requirements (REQ). Examples of the design basis specifications (DBS) may include general design criteria, safety audit guidelines, accident analysis reports, technical guidelines, etc.

The structure, system, and component specifications (SSCS) may include the functions and standards of particular systems, structures, and components derived from design basis specifications (DBS) associated with the general attributes of nuclear plants. That is, the structure, system, and component specifications (SSCS) may define how particular systems, structures, and components fulfill the design basis specifications (DBS). Generally, statements in a system design basis document may be included in the structure, system, and component specifications (SSCS), and approval and permission documents or other related documents may be included as reference documents. Also, test requirements for various components, as well as design requirements, may be included.

The supporting operation information (SOI) may include what is needed for operation and maintenance to fulfill structure, system, and component specifications (SSCS) or higher-tier design basis (for example, design basis specifications (DBS), design requirements (REQ), etc.), even if it is not necessary for design. Also, it may include information needed for operation, maintenance, repair, and inspection procedure documents. For example, system operation procedure documents, regular inspection procedure documents, emergency operation procedure documents, technical guidelines, etc. may be included in the supporting operation information (SOI).

The design parameters (DP) may include specific input and output values for systems and/or components. That is, they may include specific values or ranges of values for systems and/or components to fulfill higher-tier basis (for example, design requirements (REQ), design basis specifications (DBS), and structure, system, and component specifications (SSCS)). For example, they may include design limits, operating limits, alarm and trip settings, and normal operating ranges.

The supporting design information (SDI) may include various controlling parameters for providing design information as physical information to fulfill the structure, system, and component specifications (SSCS). That is, it may include technical information used to design actual systems, structures, or components that fulfill the structure, system, and component specifications (SSCS). For example, it may include documents needed to fulfill the structure, system, and component specifications (SSCS) such as drawings, calculations, calculation results, interface requirements, and analysis reports.

The physical structure, system, and component specification data (PSSCD) includes detailed information on various structures, systems, and components needed for performing the functions of the structures, systems, and components (SSCS). The physical structure, system, and component specification data (PSSCD) may correspond to physical structures, systems, and components, and the physical structure, system, and component specification data (PSSCD), in itself, may refer to a single design basis or design information corresponding to physical devices of the relevant structure, system, or component.

In this way, design basis for configuration management may be divided into a plurality of categories, and a plurality of design basis may correspond to each category. Also, the categories (or specific design basis corresponding to each category) may be defined to have a hierarchical relationship as described above.

The categories and hierarchical relationship of design basis will be explained with reference to FIG. 2.

Figure 2:
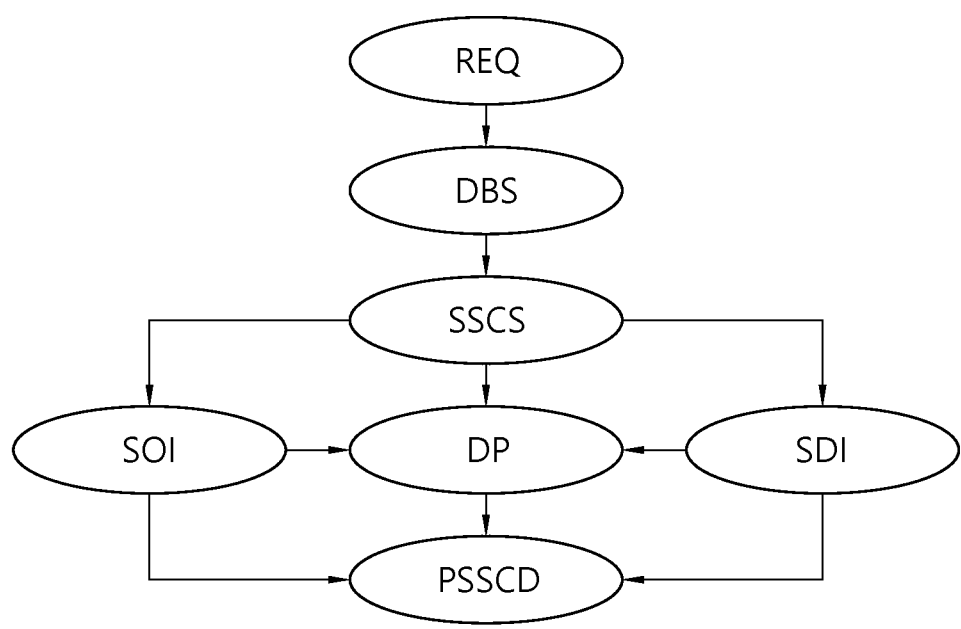
FIG. 2 is a view for explaining a hierarchical relationship in a design basis document according to an embodiment of the present invention.

FIG. 2 is a view for explaining a hierarchical relationship in a design basis document according to an embodiment of the present invention.

Referring to FIG. 2, as described above, a design basis document may include a plurality of design basis, and these design basis may be divided into categories as described above.

Each design basis may fall into one of the categories: design requirements (REQ), design basis specifications (DBS), and structure, system, and component specifications (SSCS), supporting operation information (SOI), design parameters (DP), supporting design information (SDI), and physical structure, system, and component specification data (PSSCD).

Moreover, as shown in FIG. 2, the categories may have a hierarchical relationship. If the categories have a hierarchical relationship as shown in FIG. 2, it may mean that the design basis corresponding to each category may have the same hierarchical relationship structure as the categories do.

In the hierarchical relationship structure, as described above, a second design basis created or defined to meet a first design basis corresponding to a first category and a second category corresponding to the second design basis may be defined as a lower-tier category of the first design basis and a lower-tier category of the first category, respectively. In this case, as shown in FIG. 2, design requirements (REQ) (or the first design basis corresponding to the design requirements (REQ)) containing information on the most general and comprehensive design basis may be a top-tier category, and design basis specifications (DBS) (or the second design basis corresponding to the design basis specifications (DBS) defining the requirements for fulfilling the design requirements (REQ) (or the first design basis) may be a lower-tier category of the design requirements (REQ) (or the first design basis). Also, structure, system, and component specifications (SSCS) (or a third design basis corresponding to the structure, system, and component specifications (SSCS)), which are the requirements for fulfilling the design basis specifications (DBS) (or the second design basis) may be a lower-tier category of the design basis specifications (DBS) (or the second design basis). Also, supporting operation information (SOI) (or a fourth design basis corresponding to the supporting operation information (SOI)) for fulfilling the structure, system, and component specifications (SSCS) (or the third design basis), design parameters (DP) (or a fifth design basis corresponding to the design parameters (DP)), and supporting design information (SDI) (or a sixth design basis corresponding to the supporting design information (SDI)) may be a lower-tier category of the structure, system, and component specifications (SSCS) (or the third design basis).

Moreover, the physical structure, system, and component specification data (PSSCD) (or a seventh design basis corresponding to the physical structure, system, and component specification data (PSSCD)) may be a lower-tier category of the supporting operation information (SOI) (or the fourth design basis), the design parameters (DP) (or the fifth design basis), and the supporting design information (SDI) (or the sixth design basis).

Meanwhile, since the supporting operation information (SOI) (or the fourth design basis) and the supporting design information (SDI) (or the sixth design basis) are information to be used or referenced to define the design parameters (DP) (or the fifth design basis), the supporting operation information (SOI) (or the fourth design basis), the design parameters (DP) (or the fifth design basis), and the supporting design information (SDI) (or the sixth design basis) may be defined as a same-tier category.

After all, design basis for configuration management in a nuclear plant may be divided into certain categories, and these categories may be defined to have a hierarchical relationship structure as shown in FIG. 2. Accordingly, the present invention allows for integrated storage and management of design basis having a hierarchical relationship structure and enables a user (e.g., a nuclear plant's operating entity) to detect design basis associated with a particular physical facility (structure/system/component) and fast and intuitively find an associative relationship between the detected design basis.

To this end, as shown in FIG. 1, the management system 100 according to the technical idea of the present invention may include a control module 110, a database 120, and an interface module 130.

As used herein, the term "module" refers to a functional and/or structural combination of hardware for implementing the technical idea of the present invention and software for running the hardware. For example, each of these components may indicate a logical unit of codes and hardware resources executing the codes. It is apparent to a person skilled in the art to which the present invention relates that the term "module" is not limited to physically-connected codes, one type of hardware, or a specific number of hardware components. Therefore, each of the components refers to a combination of hardware and software executing functions defined herein, but does not indicate a specific physical configuration.

Moreover, the management system 100 is not necessarily a single physical device. For example, the management system 100 according to the technical spirit of the present invention may be implemented by installing some of the components (e.g., the control module 110, the database 120, and the interface module 130) for implementing the management system 100 on one physical device and installing the rest on another physical device and organically combining the physical devices. In addition, it is apparent to a person skilled in the art to which the present invention relates that each of the components for implementing the management system 100 may be implemented separately on different physical devices if necessary.

The control module 110 may control the functions and/or resources of the components (e.g., the database 120, interface module 130, etc.) included in the management system 100.

The database 120 may store a plurality of design basis described above. The design basis may be defined and created by the nuclear plant's operating entity, and therefore the database 120 may be created by the operating entity (or an entity commissioned by the operating entity).

The design basis stored in the database 120 may be given unique identification information for identifying the design basis. This identification information too may be given by the operating entity and stored in the database 120.

Identification information of a design basis may be defined to include category identification information (e.g., REQ, DBS, SSCS, SOI, DP, SDI, and PSSCD) for identifying categories corresponding to the relevant design basis, a system to which the relevant design basis is applied, and a serial number of the relevant design basis.

Figure 3:
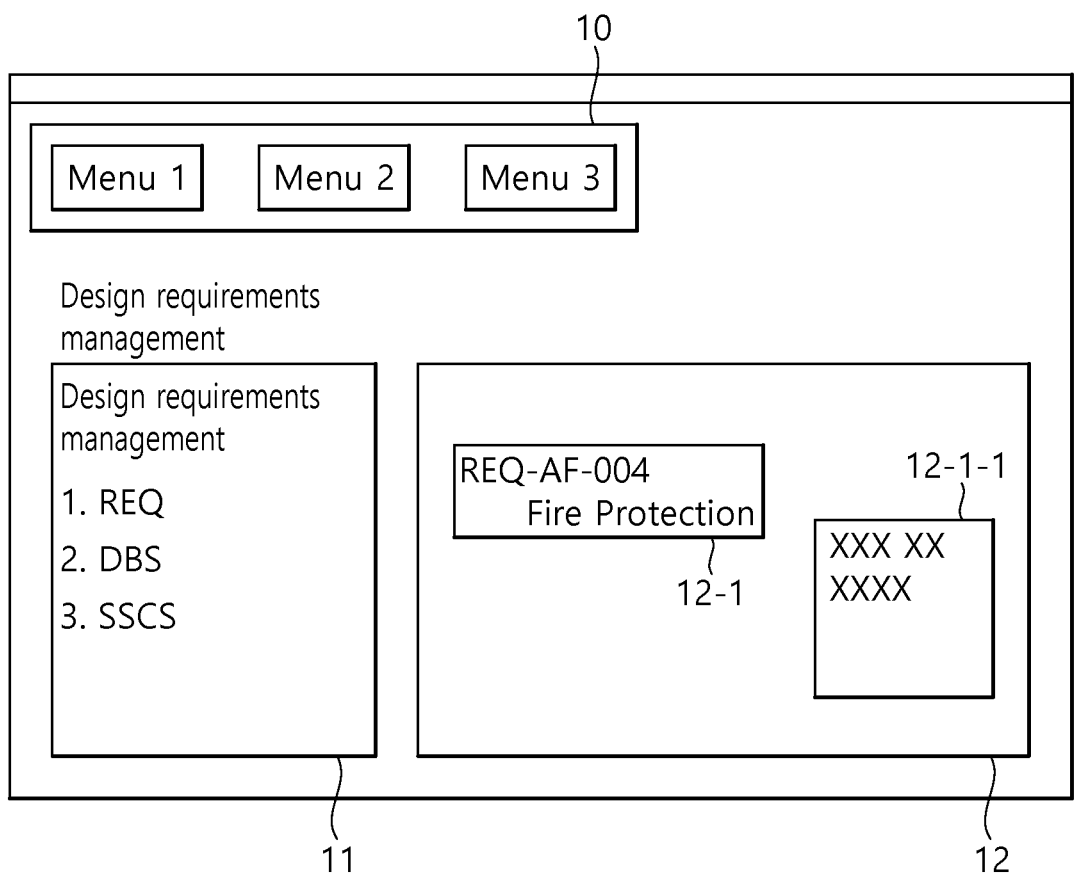
FIGS. 3 to 14 illustrate examples of information provided to the user through a nuclear power plant data-based design basis management system according to an embodiment of the present invention.

For instance, identification information (e.g., REQ-AF-001 to REQ-AF-010) of a plurality of design basis illustrated in FIG. 3 may be information indicating that the relevant basis item corresponds to the design requirements (REQ) category and the system of the relevant design basis corresponds to AF (Auxiliary Feedwater system).

Figure 5:
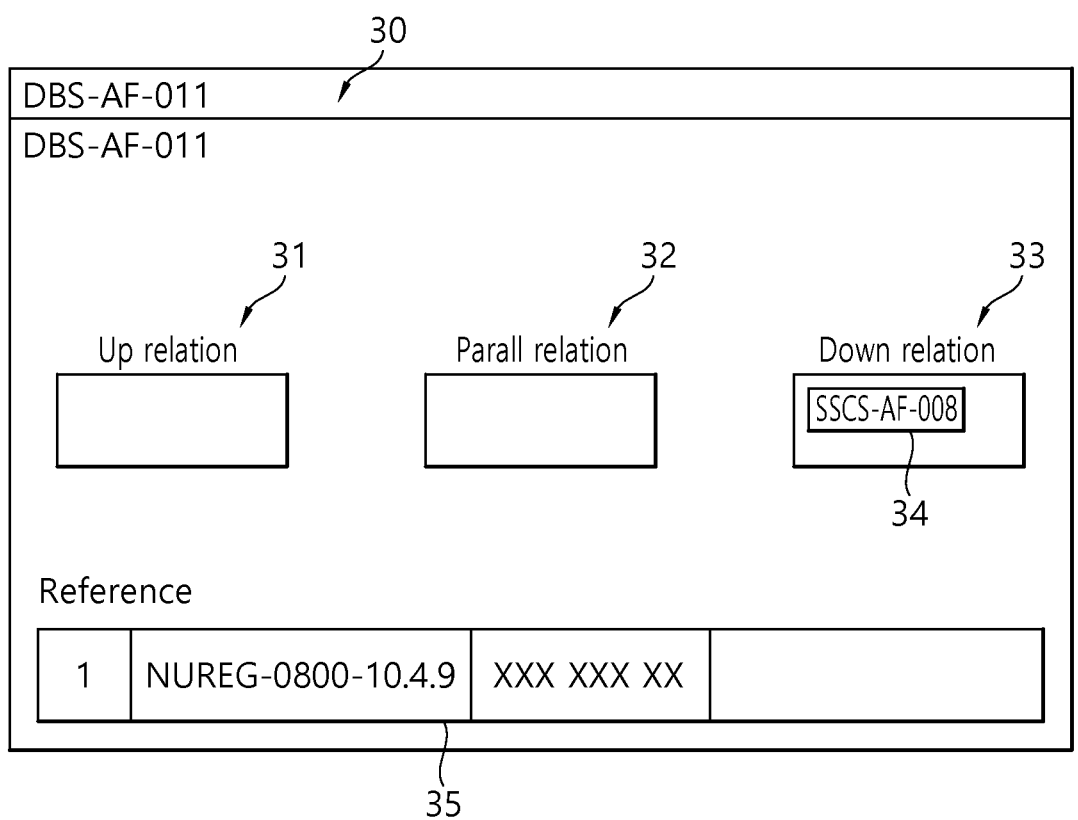

Moreover, it can be seen that the identification information DBS-AF-001 stated in the left upper corner of FIG. 5 is information indicating that the design basis corresponding to the identification information is a design basis corresponding to the design basis specifications (DBS) category and the first one of the design basis corresponding to the AF system.

In this way, the plurality of design basis may be stored in the database 120, along with information on the design basis (i.e., information on the requirements defined in the relevant design basis) and identification information for identifying the design basis.

In addition, information on a reference document for each of the design basis may be stored in the database 120 so as to correspond to the relevant design basis. The reference document may refer to a document that helps to understand and analyze the content of each design basis or a document on which each design basis is based. It is apparent that, when necessary, the nuclear plant's operating entity can define various reference documents for each design basis as corresponding to the relevant design basis and store them in the database 120.

Furthermore, information on an associative relationship between design basis may be stored in the database 120 so as to correspond to each of the design basis. This associative relationship may be identification information for identifying other design basis of other categories having an associative relationship with a particular design basis. In an example, the information on an associative relationship may include identification information of other design basis having an associative relationship and may also include information indicating whether other design basis fall into a higher-tier category, lower-tier category, or same-tier category of the particular design basis—that is, information indicating a hierarchical relationship. In some examples of implementation, it is apparent that, since identification information of each design basis includes information for identifying the category of the relevant design basis, a hierarchical relationship between other design basis and the particular design basis can be easily detected using this information, as long as information indicating a hierarchical relationship structure of categories is stored in the database 120 as shown in FIG. 2. Thus, the information on an associative relationship may include no information for indicating a hierarchical relationship with other design basis.

The control module 110 may provide the user terminal 200 with provided information on a particular design basis. To this end, the control module 110 may extract provided information corresponding to the particular design basis from the database 120. The extracted provided information on the particular design basis may be provided to the user terminal 200 via a predetermined interface shown in FIGS. 3 to 10. The predetermined interface may be defined by the interface module 130 and provided to the user terminal 200. Hereinafter, in this specification, if the control module 110 provides predetermined information to the user terminal 200, it may mean that the interface module 130 provides the predetermined information to the user terminal 200 via a predetermined provided interface.

Provided information on the particular design basis is provided to the user terminal 200 when the particular design basis is automatically selected by the user terminal 200 or by the management system 100 during a process, and may include information on the particular design basis and information on other design basis of other categories having an associative relationship with the particular design basis— that is, associated design basis. That is, when a particular design basis is selected, the control module 110 may extract information on associated design basis corresponding to the particular design basis from the database 120. Also, by providing the extracted information on associated design basis to the user terminal 200, the user may check information on the particular design basis and information on the associated design basis having an associative relationship with the particular design basis. The information on the associated design basis extracted by the control module 110 may be identification information of the associated design basis, and when the provided identification information of the associated design basis is selected by the user terminal 200, it may be provided to the user terminal 200 like the provided information of the associated design basis.

After all, according to the technical spirit of the present invention, when a particular design basis is selected, the user may easily check information on the particular design basis and information on associated design basis corresponding to the particular design basis. The control module 110 may extract information on all directly associated design basis having a directly associative relationship with the particular design basis from the database 120 and included in the provided information. In some examples of implementation, only some of the directly associated design basis may be included in the provided information.

In another embodiment, the control module 110 may extract information on a directly associated design basis having a directly associative relationship with the particular design basis and information on an indirectly associated design basis having an indirectly associative relationship with the particular design basis (that is, a design basis having an associative relationship with the particular design basis through other design basis) and further included it in the provided information.

Figure 13:
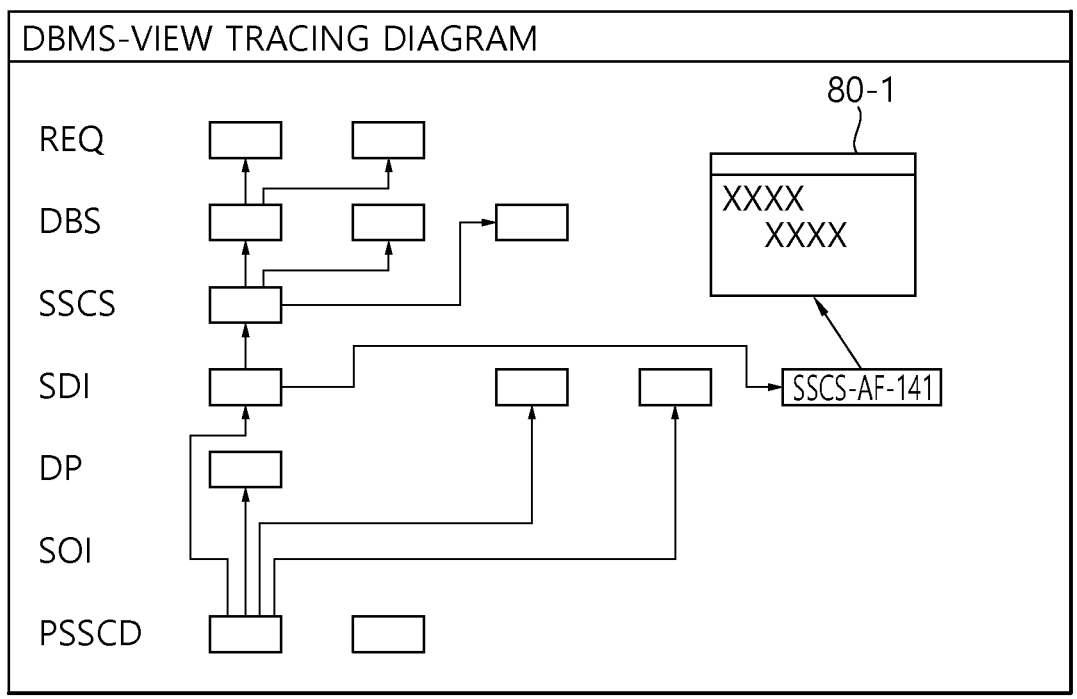
Figure 14:
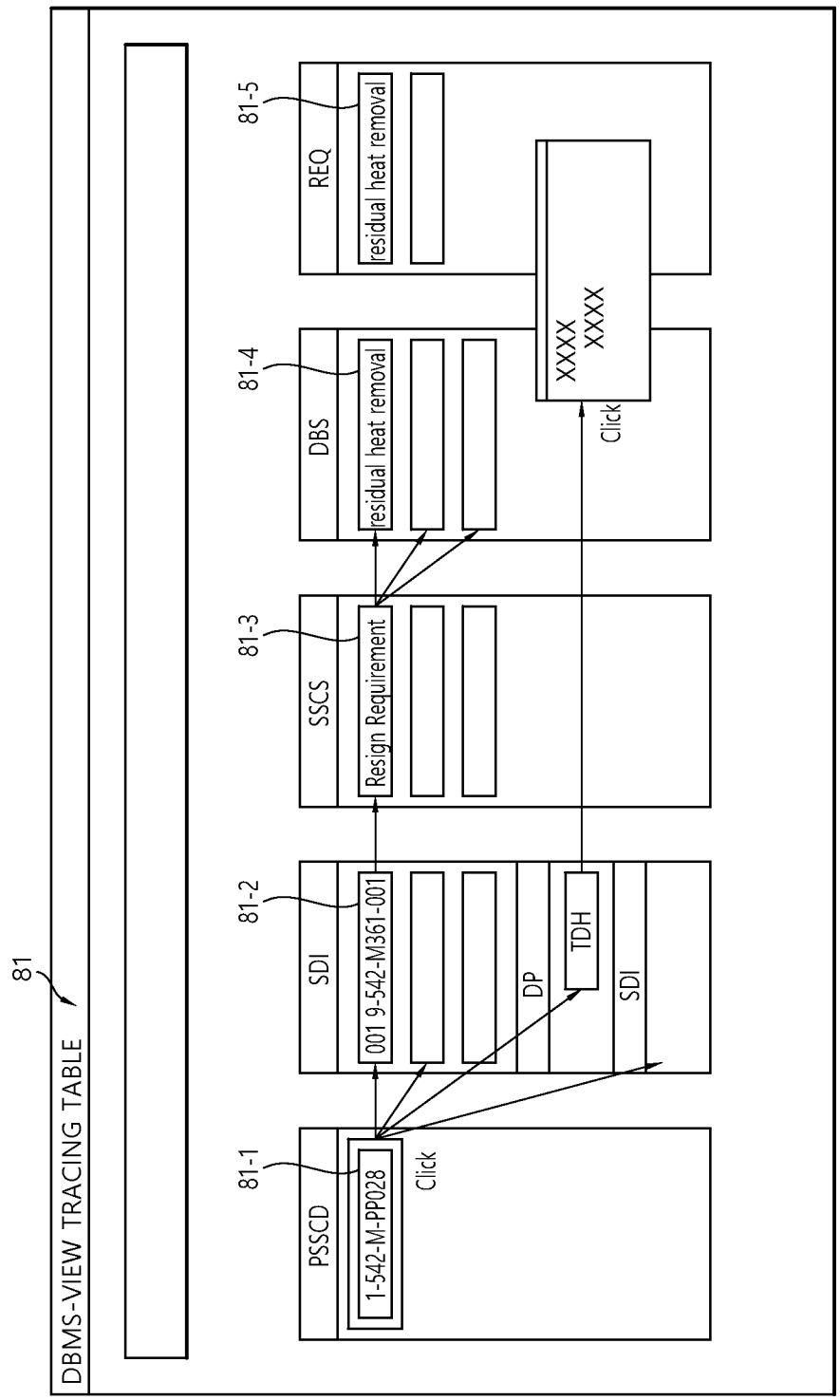

Moreover, if the particular design basis is physical structure, system, and component specification data (PSSCD), the control module 110 extracts information on all associated design basis (that is, directly associated design basis and indirectly associated design basis) having an associative relationship with the particular design basis and provided it to the user terminal 200 in a predetermined manner, and hierarchically represent the categories of the associated design basis, traceable associative relationship information may be created as described later with reference to FIGS. 13 and 14. In this case, if action is needed on a particular facility, such as replacing, changing, or repairing the particular facility, in accordance with the physical structure, system, and component specification data (PSSCD), the user may check design basis having an associative relationship with the particular facility in an integrated and intuitive way, thereby enabling fast and accurate configuration management.

Obviously, a design basis serving as a criterion for creating traceable associative relationship information is not necessarily physical structure, system, and component specification data (PSSCD), and all design basis having an associative relationship with a selected design basis may be extracted from the database 120 and provided hierarchically to the user terminal 200, regardless of the category of the selected design basis.

Meanwhile, the control module 110 may simply list information on associated design basis included in provided information and provide it to the user terminal 200, or provide the user terminal 200 with higher-tier category associated design basis, lower-tier category associated design basis, and same-tier category associated design basis in a distinguishable way so that the user can easily find a hierarchical relationship between a particular design basis and the associated design basis.

For example, using predetermined interfaces (e.g., 31 to 33) shown in FIG. 5, the control module 110 may provide the user terminal 200 with higher-tier category associated design basis (e.g., REQ-AF-001 and REQ-AF-050) and lower-tier category associated design basis (e.g., SSCS-AF-008, SSCS-AF-009, etc.) of a particular design basis (e.g., DBS-AF-001 of FIG. 5) in a visually distinguishable way. In an example of FIG. 5, it can be seen that the interface 32 corresponding to a same-tier category includes no design basis since the same-tier category does not exist in the categories of the design basis specifications (DBS) as explained with reference to FIG. 2. Accordingly, FIG. 5 illustrates an example in which only directly associated design basis are included in the provided information and provided to the user terminal 200. The control module 110 may provide the user terminal 200 with higher-tier category associated design basis, lower-tier category associated design basis, and same-tier category associated design basis in various distinguishable ways, but the scope of the present invention is not limited to the embodiment illustrated in FIG. 5. The higher-tier category associated design basis, lower-tier category associated design basis, and same-tier category associated design basis may be presented in any distinguishable way as long as the user can easily recognize them. Moreover, it is obvious that the control module 110 may store information indicating information (e.g., the hierarchical relationship structure shown in FIG. 2) for defining such a hierarchical relationship structure) in the database 120.

In addition, the database 120 may store information on a reference document for each design basis as described above. Accordingly, when a particular design basis is selected, the control module 110 may extract information on a reference document for the particular design basis as provided information of the particular design basis from the database 120 and provided it to the user terminal 200. It is obvious that, if there exists no reference document for the particular design basis (that is, no reference document is stored in the database 120), information on a reference document may not be provided to the user terminal 200.

Hereinafter, concrete embodiments of the above-described nuclear plant design basis management method performed by the management system 100 will be described concretely with reference to screen displays or information provided to the user terminal 200.

FIGS. 3 to 14 illustrate examples of information provided to the user through a nuclear power plant data-based design basis management system according to an embodiment of the present invention.

Referring to FIG. 3, the management system 100 may provide a user interface 10 shown in FIG. 3 to the user terminal 200. The user interface 10 may include a search interface 11 for detecting a plurality of design basis (also referred to as design requirements in the drawings) in a directory structure and a display interface 12 that, when a particular directory (e.g., design requirements (REQ) directory 11-1 included in the AF system, which is a mechanical system) is selected through the search interface 11, provides a plurality of design basis corresponding to the selected particular directory 11-1 to the user terminal 200.

Moreover, as can be seen in the search interface 11, the management system 100 may provide a bottom-tier directory of the directory structure for each category of design basis as described above. Each directory may store design basis for a category corresponding to the relevant directory.

The user terminal 200 may select a particular design basis (e.g., REQ-AF-004, 12-1) among the design basis displayed on the display interface 12 (for example, by placing the mouse cursor over it). Then, information on the content of the design basis (e.g., REQ-AF-004, 12-1) may be displayed via a predetermined UI 12-1-1.

Figure 4:
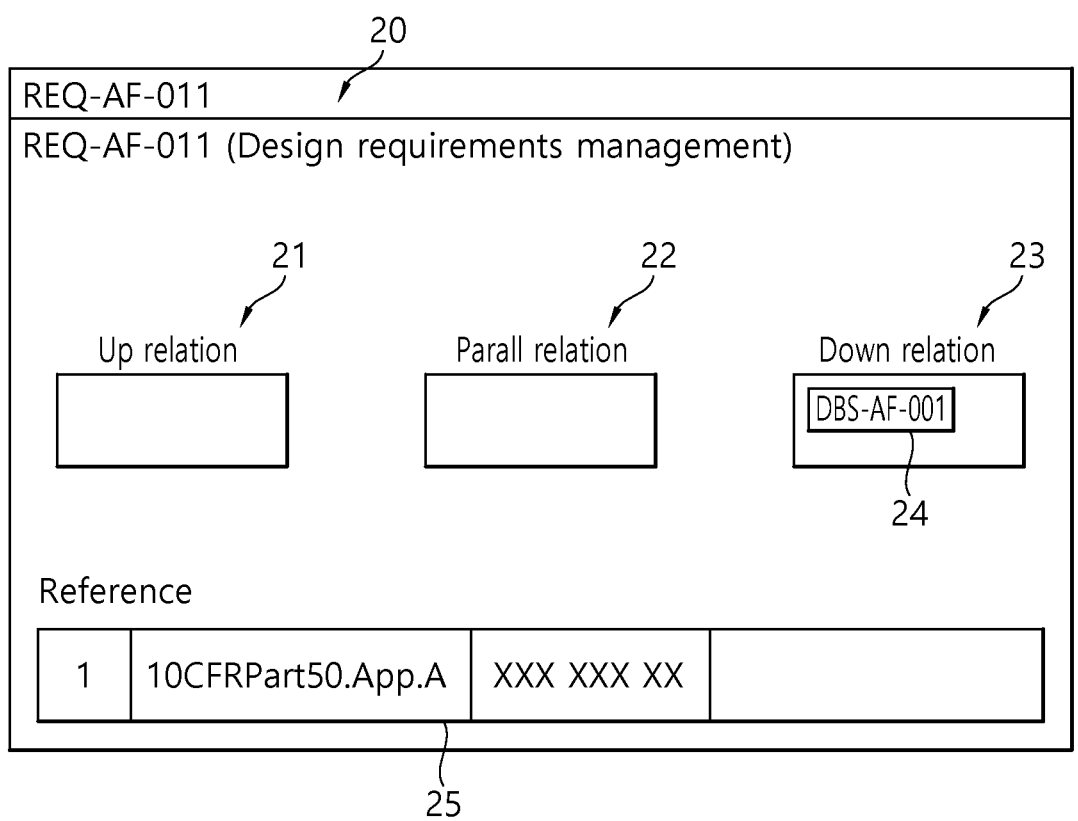

Meanwhile, when the user terminal 200 requests more concrete information on a predetermined design basis (e.g., REQ-AF-001) among the design basis displayed as shown in FIG. 3 (for example, by clicking), then the management system 100 may provide the user terminal 200 with provided information 20 of the selected design basis (e.g., REQ-AF-001) as shown in FIG. 4.

Once the design basis (e.g., REQ-AF-001) is specified, the control module 110 included in the management system 100 may extract information (e.g., an item path, identification information, title, and requirement text as shown in FIG. 4) on the design basis from the database 120 and provide this information to the user terminal 200 as the provided information 20.

Moreover, as described above, the control module 110 may extract information on associated design basis of the design basis (e.g., REQ-AF-001) and provide the information on associated design basis to the user terminal 200 as the provided information. In this case, as shown in FIG. 4, the control module 110 may divide the associated design basis into a higher-tier category 21, a lower-tier category 23, and a same-tier category 22 and provide them to the user terminal 200. It can be seen that, since the design basis (e.g., REQ-AF-001) is a design basis corresponding to a top-tier category, i.e., the design requirements REQ, there only exist lower-tier category associated design basis as shown in FIG. 4.

In addition, if a reference document (e.g., 25) corresponding to the design basis (e.g., REQ-AF-001) is stored in the database 120, the control module 110 may provide the user terminal 200 with information (identification information, description, type, etc.) on the reference document, as shown in FIG. 4.

The user may select a provided associated design basis (e.g., DBS-AF-001, 24). In response to it, the management system 100 may extract provided information of the selected associated design basis (e.g., 24) and provide it to the user terminal 200. Accordingly, the user can sequentially and easily check provided information on associated design basis while checking provided information on a particular design basis. An example of this is shown in FIG. 5.

If the user selects an associated design basis (e.g., DBS-AF-001, 24), the associated design basis (e.g., DBS-AF-001, 24) may be a design basis serving as a new criterion for extracting provided information.

As shown in FIG. 5, once the design basis (e.g., DBS-AF-001, 24) is specified, the management system 100 may specify provided information 30 of the design basis (e.g., DBS-AF-001, 24) and provide the specified provided information to the user terminal 200. As described above, the provided information may include information on the design basis (e.g., DBS-AF-001, 24) and information on associated design basis 31, 32, and 33 and/or a reference document 35.

Since the design basis (e.g., DBS-AF-001, 24) is a design basis corresponding to the design basis specification (DBS) category, there may be a higher-tier design basis 31 and a lower-tier design basis 33, as shown in FIG. 5, and information on them may be provided to the user terminal 200. When a particular associated design basis (e.g., SSCS-AF-008, 34) is selected from among the provided associated design basis, provided information on the selected design basis (e.g., SSCS-AF-008, 34) may be provided. An example of this is shown in FIG. 6.

Figure 6:
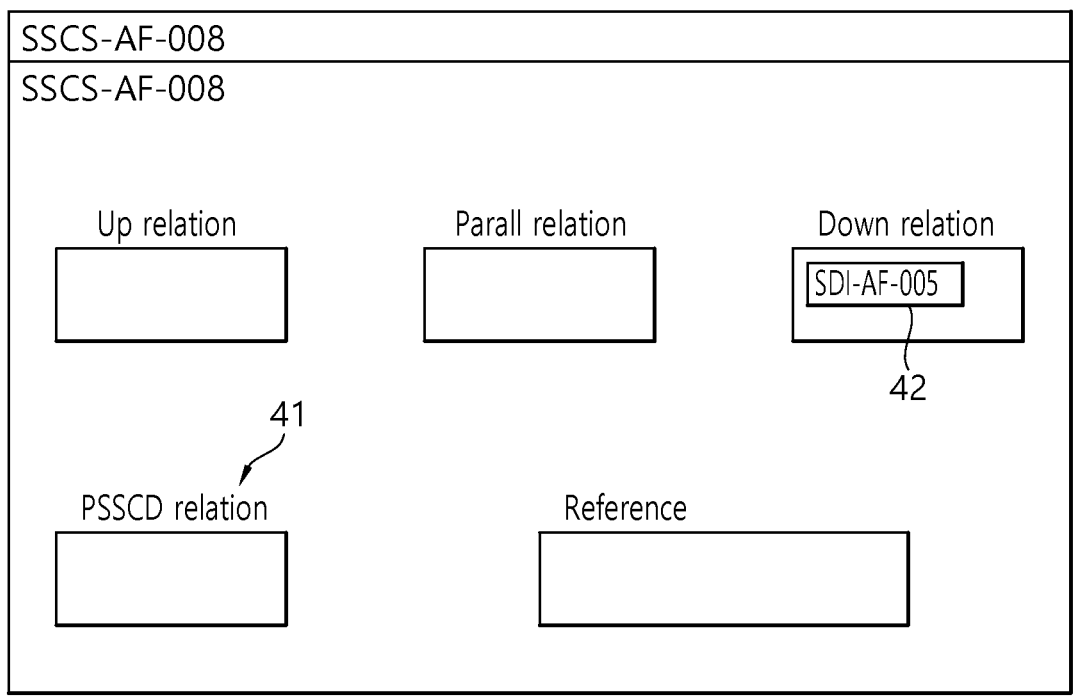

As shown in FIG. 6, provided information 40 on a new design basis (e.g., SSCS-AF-008, 34) may be provided to the user terminal 200. In FIG. 6, as explained with reference to FIGS. 4 and 5, information on the design basis (e.g., SSCS-AF-008, 34) and information on associated design basis and/or a reference document may be provided to the user terminal 200. Moreover, in some embodiments, a UI 41 for providing information on physical structure, system, and component specification data (PSSCD) showing an associative relationship may be included in the provided information 40. In FIG. 6, physical structure, system, and component specification data (PSSCD) showing a directly associative relationship may not exist in the design basis (e.g., SSCS-AF-008, 34).

Likewise, as described above, when a particular design basis (SDI-AF-005) is selected from among associated design basis provided through the provided information 40, provided information of the selected design basis (SDI-AF-005) may be provided to the user terminal 200.

Figure 7:
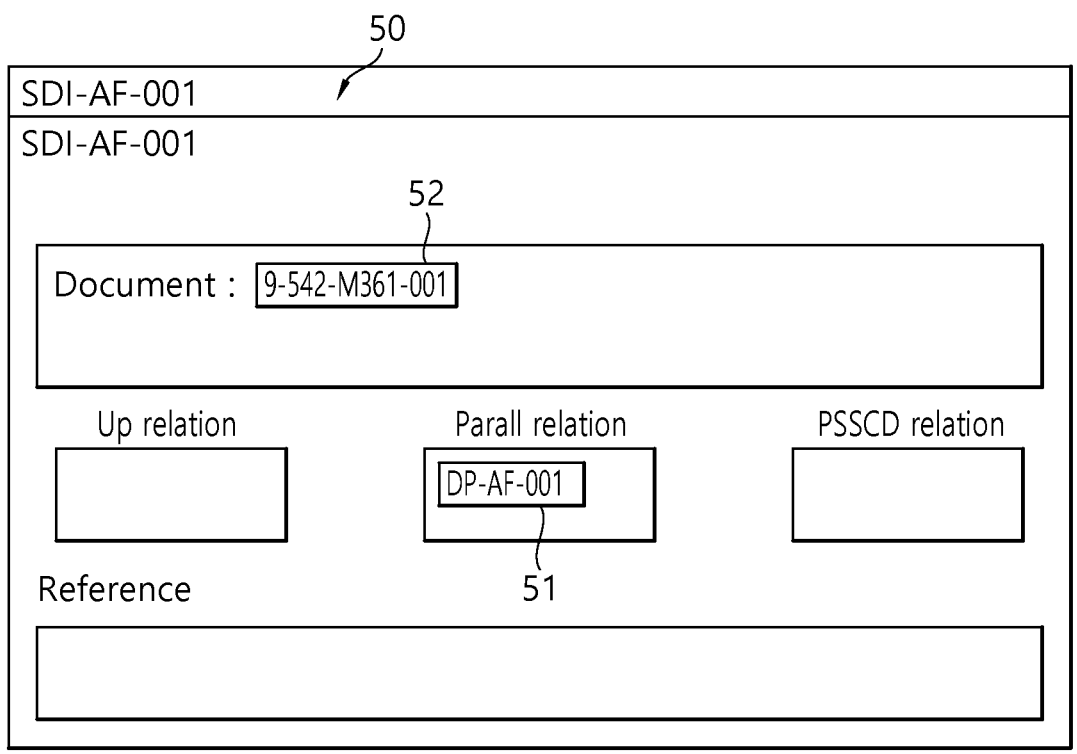

FIG. 7 illustrates provided information 50 of a design basis (e.g., SDI-AF-001) by way of example. As described above, the content of the design basis (e.g., SDI-AF-001), information on associated design basis, and a reference document may be included in the provided information of the design basis (e.g., SDI-AF-001). Moreover, since the design basis (e.g., SDI-AF-001) is a design basis corresponding to the supporting design information (SDI) category, a document (e.g., calculation results, drawings, etc., 52) corresponding to the design basis (e.g., SDI-AF-001) may exist as described above, and information on this document may be included in the provided information 50.

The user may select a certain design basis (e.g., DP-AF-001) corresponding to a same-tier category from among the associated design basis. Then, provided information 60 of the selected design basis (e.g., DP-AF-001) may be provided to the user terminal 200 as shown in FIG. 8.

Figure 8:
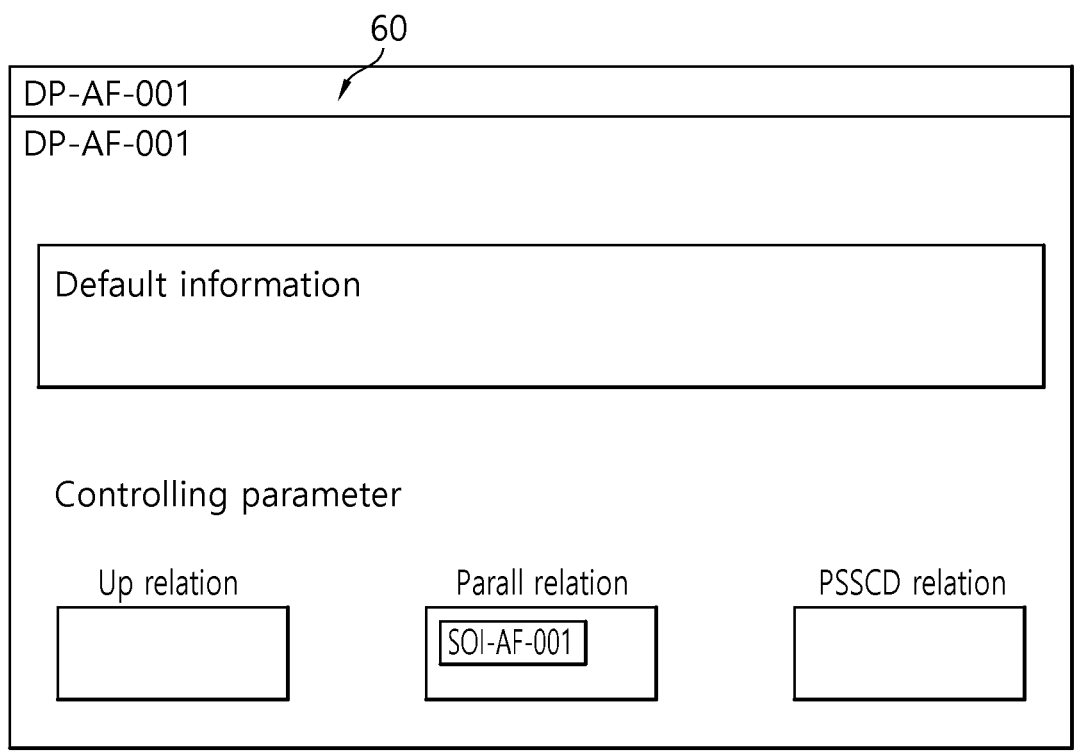

It can be seen that, since the design basis (e.g., DP-AF-001) is a design basis corresponding to the design parameters (DP) category, information on the management parameters corresponding to the design basis (e.g., DP-AF-001) is provided as provided information to the user terminal 200 as shown in FIG. 8. Obviously, information on the associated design basis and/or reference document may be provided.

Figure 9:
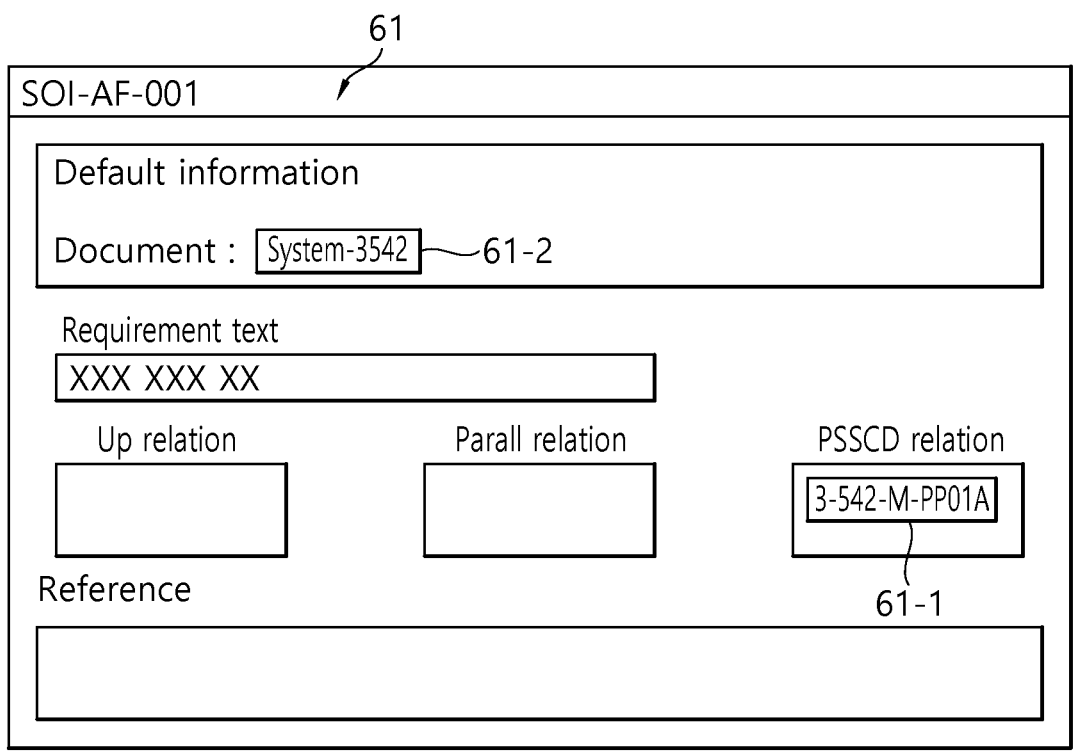

When the user selects a particular design basis (e.g., SOI-AF-001) corresponding to a same-tier category from among the provided associated design basis, provided information 61 shown in FIG. 9 may be provided to the user terminal 200.

Since the design basis (e.g., SOI-AF-001) is a design basis corresponding to the supporting operation information (SOI) category, an operation stage document (e.g., procedures, manuals, etc., 61-2) may be provided to the user terminal 200 as provided information as shown in FIG. 9.

Figure 10:
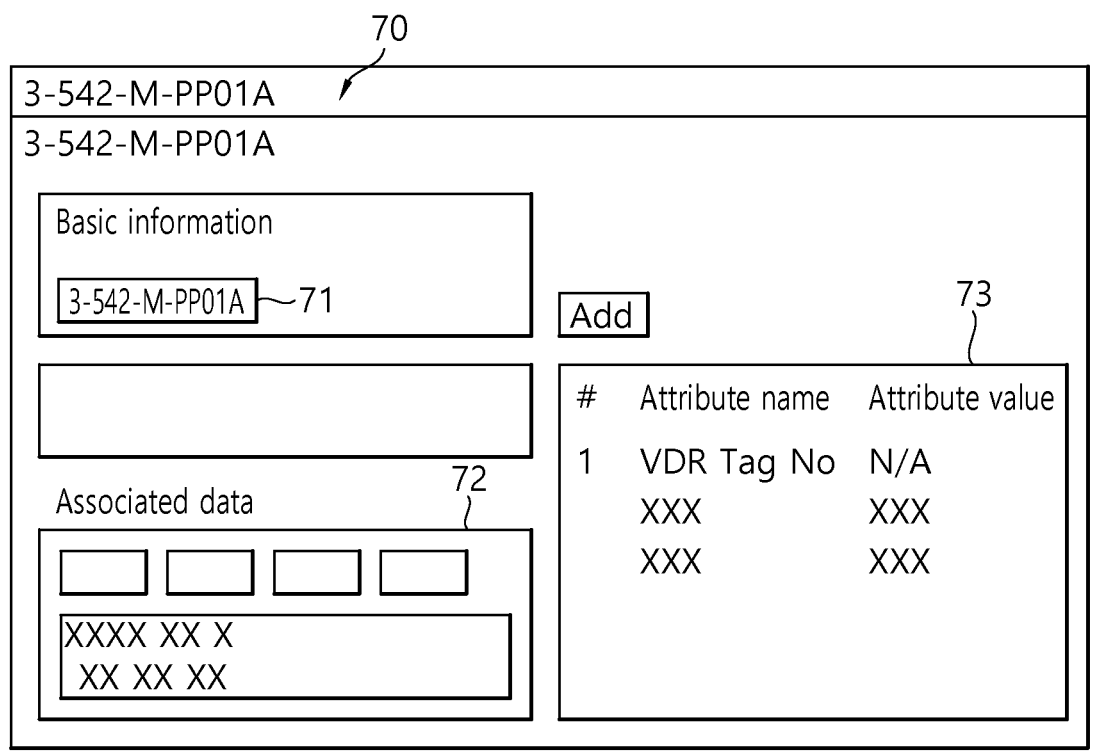

Moreover, when a certain associated design basis (e.g., 3-542-M-PP01A) included in the provided information 61 is selected, provided information 70 of the selected design basis (e.g., 3-542-M-PP01A) may be provided to the user terminal 200 as shown in FIG. 10.

Since the design basis (e.g., 3-542-M-PP01A) corresponds to the physical structure, system, and component specification data (PSSCD), the design basis (e.g., 3-542-M-PP01A) may be identified by identification information (e.g., tag information, 71) representing design information for a particular facility.

The database 120 may store tag information for each particular facility. It is obvious that, as described above, a design basis corresponding to the physical structure, system, and component specification data (PSSCD) category may mean design information corresponding to a particular facility. As shown in FIG. 10, design information corresponding to a particular facility may include basic information, location information, additional information, and attribute information 73 of the relevant facility.

Moreover, for a design basis (or facility) corresponding to the physical structure, system, and component specification data (PSSCD) category, no higher-tier category associated design base, same-tier category associated design basis, or lower-tier category associated design basis are represented as described above, but instead information on associated design basis having a directly or indirectly associative relationship with the facility may be provided. That is, it is not represented as a higher-tier category, lower-tier category, or same-tier category associated design basis as shown in FIGS. 4 to 9, but may be collectively represented as design basis 72 associated with a particular facility.

Meanwhile, according to the technical spirit of the present invention, the database 120 may store physical plant configuration information corresponding to the physical structure, system, and component specification data (PSSCD).

The physical plant configuration information may refer to information on, for example, the functional location of a facility to subject to maintenance and repair, a facility number, a product serial number, facility specification information, and maintenance and repair records. The physical plant configuration information may refer to information on a physical facility designed in accordance with tag information. Also, the functional location may refer to information on a location where maintenance and repair should be done or may be defined as a term used to refer to a system area where the particular facility should be installed. After all, the particular facility is specified as part of the entire equipment only when the particular facility is installed at the relevant functional location.

After allocating tag information for the particular facility, the user may enter physical plant configuration information (e.g., information on the functional location, etc.) corresponding to the particular facility, apart from the tag information, through the user terminal 200. It is obvious that the entered physical plant configuration information may be stored to be included in or correspond to the physical structure, system, and component specification data (PSSCD) corresponding to the particular facility to be stored in the database 120. An example of this is shown in FIG. 11.

Figure 11:
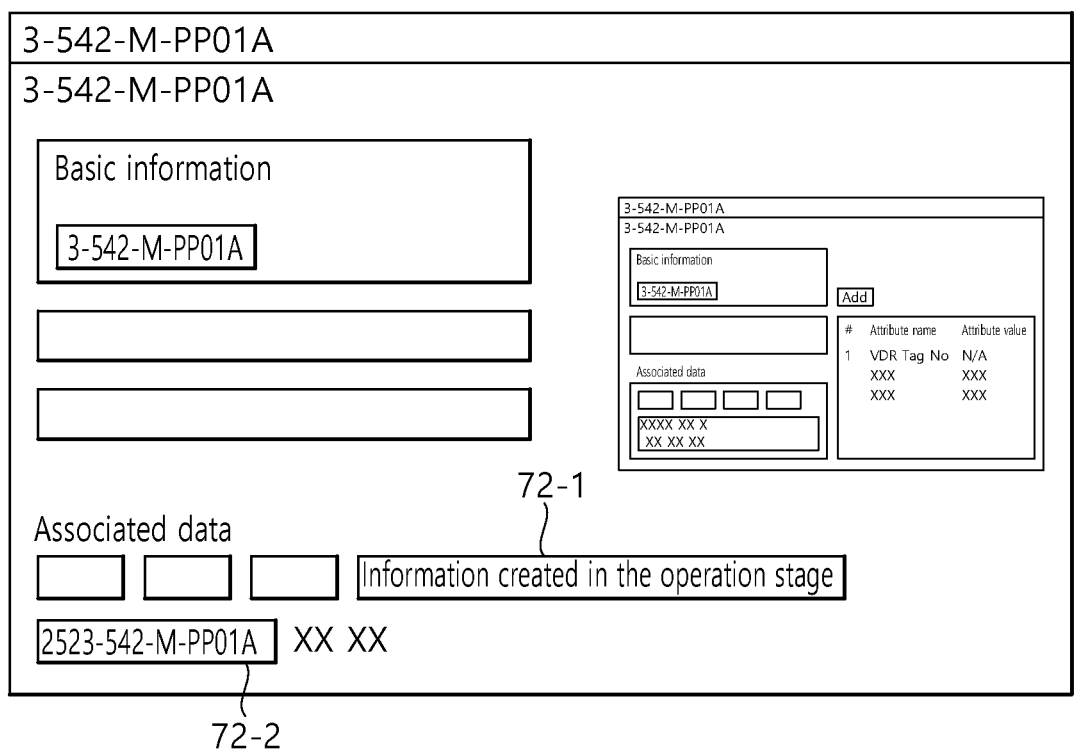

As shown in FIG. 11, the user may receive the provided information 70 of the physical structure, system, and component specification data (PSSCD) corresponding to the particular facility (e.g., 3-542-M-PP01A) from the management system 100 as shown in FIG. 10. Also, the user may allocate identification information (e.g., 2523-542-M-PP01A, 72) to the physical plant configuration information (e.g., functional location, etc.) corresponding to the particular facility (3-542-M-PP01A) through a predetermined UI 70-1. Also, the user may create and manage the physical plant configuration information (e.g., functional location, etc.) to which identification information (e.g., 2523-542-M-PP01A) is allocated. An example of this is shown in FIG. 12.

Figure 12:
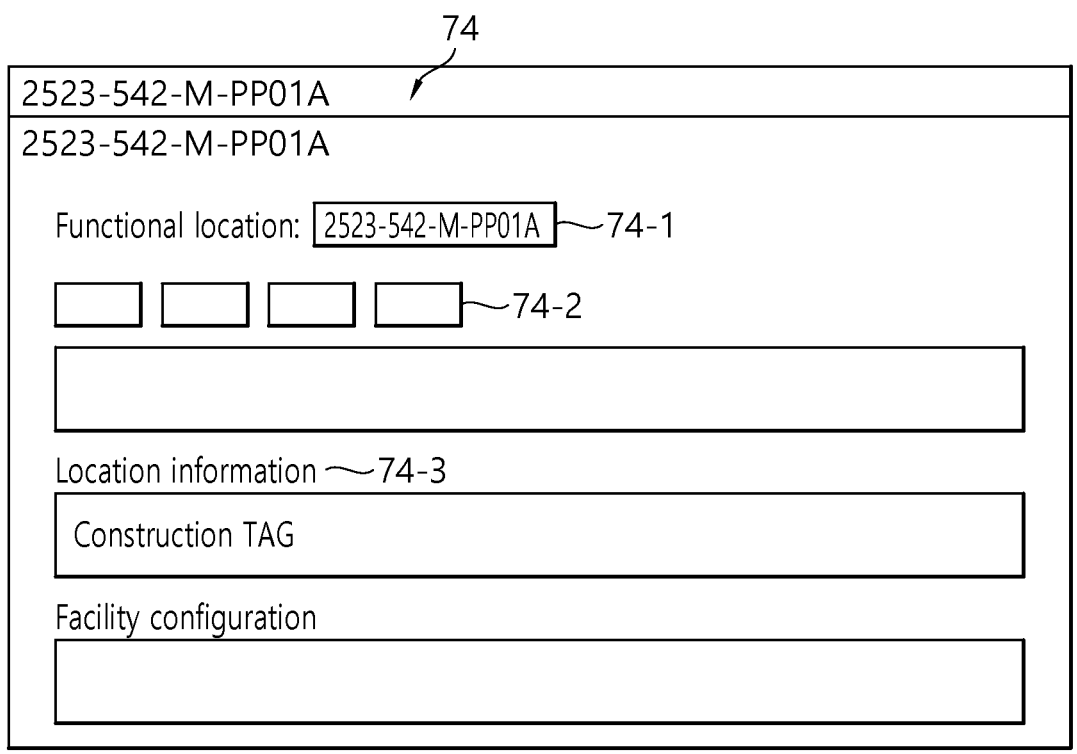

As shown in FIG. 12, the control module 110 of the management system 100 may provide an interface for entering, storing, and/or managing information on the physical plant configuration information (e.g., functional location, etc.) of a particular facility (e.g., 3-542-M-PP01A) through the interface module 130.

Through the physical plant configuration information (e.g., functional location, etc.) provided via this interface, the user may detect information associated with the physical facility installed at the functional location, as well as design information on the particular facility.

Meanwhile, as described above, the control module 110 of the management system 100 may create traceable associative relationship information hierarchically representing information on a plurality of design basis having an associative relationship, from particular physical structure, system, and component specification data to the design requirements category, which is a top-tier category corresponding to the particular physical structure, system, and component specification data. Also, the created traceable associative relationship information may be provided to the user terminal. Through this information, the user may check design basis associated with the particular facility in an integrated and hierarchical manner. Also, through this information, the user may take all design basis to be checked or reviewed into consideration if action is needed on the particular facility. The traceable associative relationship information may be created in the form of a diagram or provided in table form. An example of this is shown in FIGS. 13 and 14.

FIG. 13 shows an example in which traceable associative relationship information is created in the form of a diagram.

As shown in FIG. 13, the traceable associative relationship information includes physical structure, system, and component specification data (PSSCD) corresponding to a particular facility and higher-tier design basis of the physical structure, system, and component specification data (PSSCD)—that is, design basis (e.g., design basis corresponding to supporting operation information (SOI), design parameters (DP), and supporting design information (SDI)) having a directly associative relationship. Also, design basis (e.g., design basis corresponding to the structure, system, and component specifications (SSCS), design basis corresponding to the design basis specifications (DBS), and design basis corresponding to the design requirements (REQ)) having an indirectly associative relationship with the physical structure, system, and component specification data (PSSCD) may be included in a diagram. An associative relationship between the design basis included in the diagram are indicated by arrows in FIG. 13.

In this way, the control module 110 may create traceable associative relationship information and provided it to the user terminal 200, and the user may check all design basis associated with a particular facility at a time through this information. Also, since the design basis can be represented in a hierarchical structure as shown in the drawing, the user may intuitively find a hierarchical relationship structure between the design basis. Also, when a certain design basis (e.g., 80-1) included in the traceable associative relationship information is selected, the user may inquire for provided information on the selected design basis first before anything else, rather than sequentially checking design basis as explained with reference to FIGS. 3 to 12.

FIG. 14 shows another embodiment of the traceable associative relationship information, that is, an example in which traceable associative relationship information 81 is created and provided in table form.

As shown in FIG. 14, when the user selects a design basis (or tag information, 81-1) corresponding to physical structure, system, and component specification data (PSSCD) corresponding to a particular facility, information on design basis (e.g., supporting operation information (SOI), design parameters (DP), and supporting design information (SDI)) having a directly associative relationship with the selected facility may be detected and provided to the user terminal 200. When a particular design basis (e.g., 81-2) is selected from among the detected design basis, design basis of a higher-tier category (e.g., the structure, system, and component specifications (SSCS)) having a directly associative relationship with the selected design basis (e.g., 81-2) may be detected and provided to the user terminal 200 as shown in FIG. 14.

Likewise, when a particular design basis (e.g., 81-3) is selected from among the provided design basis, design basis of a higher-tier category (e.g., the design basis specifications (DBS)) having a directly associative relationship with the selected design basis (e.g., 81-3) may be detected and provided to the user terminal 200 as shown in FIG. 14. Also, when a particular design basis (e.g., 81-4) is selected from among the provided design basis, design basis (e.g., 81-5) of a higher-tier category (e.g., the design requirements (REQ)) having a directly associative relationship with the selected design basis (e.g., 81-4) may be detected and provided to the user terminal 200 as shown in FIG. 14.

After all, traceable associative relationship information created in table form makes it easy for the user to sequentially detect and inquire for design basis associated with a particular facility, and the traceable associative relationship information may be sequentially created as the user chooses. Also, through this traceable associative relationship information created in table, the user may immediately check provided information of a certain design basis (e.g., 81-6) by selecting this design basis from among the currently provided design basis.

The nuclear power plant data-based design basis management method according to the exemplary embodiments may be implemented as computer-readable codes in a computer readable medium. The computer-readable recording medium includes all types of recording media in which data readable by a computer system is stored.

Examples of the computer-readable recording medium include a magnetic medium, such as a hard disk, a floppy disk and a magnetic tape, an optical medium, such as a CD-ROM and a DVD, a magneto-optical medium, such as a floptical disk, and a hardware memory, such as a ROM, a RAM and a flash memory, specifically configured to store and execute program instructions. Furthermore, the aforementioned medium may be a transmission medium, such as an optical or metal line and a waveguide, including carriers for transmitting a signal to designate a program command, a data structure, or the like. In addition, the computer-readable recording medium is distributed in a computer system connected via a network so that computer-readable codes can be stored and executed in a distributed manner.

Examples of the program instructions include high-tier language codes that can be executed by a computer using an interpreter or the like, as well as machine codes such as those generated by a compiler.

The hardware devices may be configured to operate as one or more software modules in order to perform operations of the present invention, and vice versa.

While exemplary embodiments of the present invention have been described in connection with the exemplary embodiments illustrated in the drawings, they are merely illustrative embodiments, and the invention is not limited to these exemplary embodiments. It is to be understood that various equivalent modifications and variations of the exemplary embodiments can be made by a person having an ordinary skill in the art without departing from the spirit and scope of the present invention. Therefore, the true technical scope of the present invention should be defined by the technical spirit of the appended claims.

The invention claimed is:

1. A nuclear power plant data-based design basis management system, the system comprising:
   a database that stores information on a plurality of design basis for defining a design basis document for configuration management in a nuclear power plant, information on categories corresponding to the design basis, among a plurality of categories, and an associative relationship between the plurality of design basis;
   a control module that, when a particular design basis corresponding to a particular one of the plurality of categories is selected by a user terminal, extracts provided information of the selected particular design basis from the database, the provided information of the particular design basis comprising information on the particular design basis and information on associated design basis having an associative relationship with the particular design basis and falling into other categories; and
   an interface module for providing the information extracted by the control module to the user terminal via a predetermined user interface,
   wherein the plurality of categories comprise design requirements (REQ), at least one design basis specification (DBS) for satisfying the design requirements, at least one structure, system, and component specification (SSCS) for satisfying the design basis specifications, supporting operation information (SOI), design parameters (DP), and supporting design information (SDI) for satisfying the structure, system, and component specifications, and physical structure, system, and component specification data (PSSCD) complying with the supporting operation information (SOI), design parameters (DP), and supporting design information (SDI).

2. The system of claim 1, wherein the associative relationship is classified as a higher-tier, lower-tier, or same-tier category relationship between the design basis, wherein, when the particular design basis is selected, the control module provides the user terminal with associated design basis corresponding to higher-tier, lower-tier, and same-tier categories of the particular design basis in a distinguishable way.

3. The system of claim 2, wherein the design requirements (REQ) are defined as a top-tier category, the design basis specifications (DBS) are defined as a lower-tier category of the design requirements (REQ), the structure, system, and component specifications (SSCS) are defined as a lower-tier category of the design basis specifications, the supporting operation information (SOI), design parameters (DP), and supporting design information (SDI) are defined as lower-tier categories of the structure, system, and component specifications, the physical structure, system, and component specification data (PSSCD) is defined as a lower-tier category of the supporting operation information (SOI), design parameters (DP), and supporting design information (SDI), and the supporting operation information (SOI), design parameters (DP), and supporting design information (SDI) are defined as same-tier categories.

4. The system of claim 1, wherein the database stores information on a reference document for each of the design basis, and, when the particular design basis is selected, the control module provides information on the reference document through the interface module if there is a reference document for the particular design basis.

5. The system of claim 1, wherein the database stores tag information for a facility corresponding to the physical structure, system, and component specification data (PSSCD).

6. The system of claim 5, wherein the database further comprises physical plant configuration information for a facility corresponding to the physical structure, system, and component specification data (PSSCD), and, when the physical structure, system, and component specification data is selected, the control module provides the physical plant configuration information.

7. The system of claim 1, wherein the control module creates traceable associative relationship information hierarchically representing information on a plurality of design basis having an associative relationship, from particular physical structure, system, and component specification data to the design requirements category, which is a top-tier category corresponding to the particular physical structure, system, and component specification data, and provides the created traceable associative relationship information to the user terminal.

8. The system of claim 7, wherein, when a certain design basis included in the traceable associative relationship information is selected, the user provides provided information of the selected design basis to the user terminal.

9. A nuclear power plant data-based design basis management method, the method comprising:
  storing, by a nuclear power plant data-based design basis management system, information on a plurality of categories for defining a design basis document for configuration management in a nuclear power plant, information on at least one design basis included in each of the categories, and an associative relationship between the plurality of design basis;
  when a particular design basis corresponding to a particular one of the plurality of categories is selected by a user terminal, extracting, by the nuclear power plant data-based design basis management system, provided information of the selected particular design basis from the database, the provided information of the particular design basis comprising information on the particular design basis and information on associated design basis having an associative relationship with the particular design basis and falling into other categories; and
  providing, by the nuclear power plant data-based design basis management system, the extracted information to the user terminal via a predetermined user interface.

10. The method of claim 9, wherein, in the step of providing, by the nuclear power plant data-based design basis management system, the extracted information to the user terminal via a predetermined user interface, the nuclear power plant data-based design basis management system provides the user terminal with associated design basis corresponding to higher-tier, lower-tier, and same-tier categories of the particular design basis in a distinguishable way.

11. The method of claim 9, wherein, when a particular design basis corresponding to a particular one of the plurality of categories is selected by the user terminal, in the step of extracting provided information of the particular design basis from the database by the nuclear power plant data-based design basis management system,
  if the particular design basis is the physical structure, system, and component specification data (PSSCD), the nuclear power plant data-based design basis management system extracts physical plant configuration information for a facility corresponding to the physical structure, system, and component specification data and includes the same in the provided information of the particular design basis.

12. The method of claim 9, further comprising:
  creating, by the nuclear power plant data-based design basis management system, traceable associative relationship information hierarchically representing information on a plurality of design basis having an associative relationship, from particular physical structure, system, and component specification data to the design requirements category, which is a top-tier category corresponding to the particular physical structure, system, and component specification data; and
  providing the created traceable associative relationship information to the user terminal.

13. A computer program installed on a data processor and recorded to perform the method of claim 9.

* * * * *